United States Patent [19]

Bertin et al.

[11] Patent Number: 4,861,533
[45] Date of Patent: Aug. 29, 1989

[54] METHOD OF PREPARING SILICON CARBIDE CAPILLARIES

[75] Inventors: Robert Bertin, San Jose, Calif.;
Michael B. Miller, DeSota, Tex.;
Burl M. Moon, Richardson, Tex.;
Robert C. Post, Dallas, Tex.

[73] Assignee: Air Products and Chemicals, Inc., Allentown, Pa.

[21] Appl. No.: 121,203

[22] Filed: Nov. 18, 1987

Related U.S. Application Data

[62] Division of Ser. No. 933,007, Nov. 20, 1986, Pat. No. 4,772,498.

[51] Int. Cl.4 .............................................. C04B 35/56
[52] U.S. Cl. ........................................ 264/81; 264/317
[58] Field of Search ................................... 264/81, 317

[56] References Cited

U.S. PATENT DOCUMENTS

| 3,472,443 | 4/1966 | Holzl et al. | 228/3 |
| 3,943,218 | 3/1976 | Dietze et al. | 264/81 |
| 3,961,003 | 6/1976 | Parsels | 264/81 |
| 4,035,460 | 7/1977 | Dietze et al. | 264/81 |
| 4,171,477 | 10/1979 | Funari | 219/56.21 |
| 4,427,445 | 1/1984 | Holzl et al. | 75/234 |
| 4,515,860 | 5/1985 | Holzl | 428/408 |
| 4,581,295 | 4/1986 | DeLiso et al. | 428/446 |

FOREIGN PATENT DOCUMENTS 61-204946  9/1986  Japan ..................... 264/81

OTHER PUBLICATIONS

Brochure: "Hughes Puts Automatic Hybrid Bonding In A Whole New Light".
"Microelectronic Manufacturing and Testing" Aug. 1984, pp. 53–55.

Primary Examiner—James Derrington
Attorney, Agent, or Firm—Richard A. Dannells, Jr.; William F. Marsh; James C. Simmons

[57] ABSTRACT

A capillary for use in ball bonding tools designed to bond metal leads to the bonding pads on a microchip and pads or leads on a chip support is formed by chemically vapor depositing a substantially smooth silicon carbide coating having high electrical resistivity onto a substrate which is then removed by etching or combustion.

8 Claims, 4 Drawing Sheets

METHOD OF PREPARING SILICON CARBIDE CAPILLARIES

This is a division of application Ser. No. 933,007, filed Nov. 20, 1986, now U.S. Pat. No. 4,772,498, issued Sept. 20, 1988.

TECHNICAL FIELD

This invention relates to capillaries for ball bonding fine electrical conductor wire to electrical components and more particularly, to silicon carbide capillaries having particular application in thermosonic bonding tools, a method for making the same by chemical vapor deposition (CVD) techniques and an apparatus for incorporating such capillaries.

BACKGROUND OF THE PRIOR ART

The tremendous growth of the semiconductor industry has required suppliers of components used in the fabrication of silicon integrated circuits (ICs)s to come up with improvements in their products to increase the productivity of ICs without increasing their cost. One example of the need for such an improvement is to increase the wear life of the capillaries or weld tip guides used in the wire ball bonding operation of the IC fabrication process. In such an operation, a clean, bar fine electrical conductor such as gold, aluminum or silver is attached between a bonding pad on the IC chip and pins on the chip support. Specifically, the fine electrical conductor wire or filament, usually about 0.7 to 5 mils in thickness (0.007 in. to 0.005 in.), is fed through the bonding tool known as the capillary. In the case of the currently most popular bonding means, i.e. thermosonic bonding, the capillary is held in an ultrasonic transducer horn, a ball is formed at the tip end of the capillary by melting the wire using an electrical spark, and the ball is bonded between the bonding pad and pins by a combination of thermocompression and ultrasonic techniques; see Microelectron Manufacturing and Testing, August 1984, pages 53-54. Thermosonic bonding is done in bonding machines which include relatively simple manually operated types to more advanced high speed fully automatic wire bonders, which include microprocessors for pattern recognition and maintaining bonding schedules; see the product brochure for the Model 2460 thermosonic gold ball bonding machine by Hughes Aircraft Company.

The majority of capillaries produced in the semiconductor industry today and used in such thermosonic bonders are made of molded alumina. Such alumina capillaries are low in cost and can be discarded after use rather than having to clean or to reclaim them. However, the chief drawback of molded alumina capillaries is their relatively short wear life in high speed electronic flame off (EFO) bonding applications due to their lower resistance to thermal shock. This results in frequent replacement which lowers overall productivity during the bonding operation. Diamond, ruby and sapphire tipped capillaries have the requisite long wear life, but they do not sell at competitive prices, must be cleaned during use and should be reclaimed after their useful life.

Alumina capillaries are formed by a process which comprises mixing an aqueous slurry of alumina with a proper binder, molding the mixture into a compact shape over a mold pin and sintering the alumina to form the finished product. It is the binders used in the forming process that contribute to failures of the capillaries during use.

A process for producing capillaries by chemical vapor deposition (CVD) techniques is well known in the art; see Holzl et al, U.S. Pat. No. 3,472,443. In the process, a molecularly bonded chemical vapor deposited metal, which is non-reactable with the hot ball and wire, is coated onto a mold and the mold is readily removed from the resulting capillary. Although the patentees disclose that any suitable highly refractory hard material having a Vickers microhardness in excess of about 400 kg/mm$^2$ can be used to produce the capillaries, they disclose that particularly suitable materials include tungsten, rhenium an molybdenum, and tantalum and alloys thereof, such as tungsten-carbide, tungsten-molybdenum and tungsten-rhenium, as well as tantalum-carbide and columbium-carbide. Such capillaries are unsuitable in thermocompression and ultrasonic bonders which use electric generators for producing the hot ball and thus, require resistivities of no less than 0.1 ohm-cm. No suggestion is made in this patent of preparing silicon carbide capillaries by CVD techniques and hence, the patentees had no recognition of the problems which are associated with preparing such capillaries and which had to be overcome to produce CVD silicon carbide capillaries.

It is also known to manufacture capillaries from relatively low melting point cementitious metals, such as cobalt, titanium and nickel. Such capillaries must be sintered using binder materials which have the disadvantage of reacting with the fine wire of the bonding operation causing loss of bond strength. Electrochemical deposition methods for forming capillaries have been used to produce nickel, copper and iron capillaries which are all unsuitable because these metals react with the fine wire.

An entirely different bonding method is disclosed and claimed in U.S. Pat. No. 4,171,477 which requires that the capillary be electrically conductive. The patentee discloses that in the case of bonding gold wire, capillaries are used comprising titanium carbide. Although for other fine wire materials, they suggest the use of graphite, silicon carbide, zirconium boride-silicon carbide, and silicon crystals. This patent does not include any details of the method for making such a capillary.

Even though the prior art may have suggested CVD silicon carbide capillaries to those skilled in the CVD art, until the present invention there was no disclosure in the prior art of silicon carbide capillaries having the necessary physical properties for use in EFO type of bonders nor any disclosure of a method for manufacturing silicon carbide capillaries having such properties using CVD techniques.

SUMMARY OF THE INVENTION

In summary, the present invention is directed to an article of manufacture comprising a capillary having an axially extending passage terminating in a relatively small diameter guide opening at an end thereof through which a fine, electrical conductor wire is adapted to pass and which is for engaging a hot ball on the wire by thermocompression or thermosonic means. The capillary consisting essentially of a substantially smooth chemically vapor deposited coating of silicon carbide and having a room temperature resistivity of at least 0.1 ohm centimeters, a uniform Vickers hardness greater than 2500 kilograms/millimeter$^2$; a density of at least 3 gm/cm$^3$; a thermal shock resistance factor (TSR) of at least 180, a dimensionless number where $R=\sigma/E\alpha$, $\sigma$ (sigma) = stress in $MPa/m^2$, $E$ = modulus of elasticity in $MPa/m^2$, and $\alpha$ (alpha) = coefficient of thermal expansion cm/cm/° C.; and a fracture toughness of at least 3.7 $K_{IC}$ MPa/m (megapascals times the square root of a meter). Preferably, the resistivity of the resulting silicon carbide coated capillary is at least 1 ohm cm, a uniform Vickers hardness of greater than 2800 $kg/mm^2$, a density of at least 3.15 $gm/cm^3$, a TSR of at least 190 and a fracture toughness of at least 4 $K_{IC}$.

The capillary is made by a method comprising:

(a) chemically vapor depositing a substantially smooth outer refractory coating onto a substrate having a tapered end by introducing, in the absence of oxygen or oxygen-containing compound, a gaseous mixture capable of depositing silicon carbide onto the substrate;

(b) controlling the rate of deposition of silicon carbide onto the substrate within the range of about 1 to 3 mils/hour at a temperature in the range of about 1200° to 1400° C.;

(c) machining the resulting silicon carbide coated substrate to the desired overall length;

(d) machining the tapered end of the coating to the desired diameter; and (e) removing the substrate from the outer silicon carbide coating to form the axially extending passage and the guide opening through which the wire to be bonded is fed.

Very generally, the method of the present invention produces a substantially smooth, uniform, hard, fine-grained coating of silicon carbide, which is sufficiently high in electrical resistivity that the resulting capillary does not arc when subjected to an electric spark generator during EFO bonding. In such a bonding process, the end of the fine wire to be bonded is positioned just below the bonding tip by passing the wire through the wire-guide hole in the tip. The nonconductive nature of the silicon carbide is such that on applying electric energy, a spark of high density plasma is created below the bonding tip encircling the wire which causes the wire to melt to form a ball of molten metal. The bonding tip exerts a load on the tip which causes the molten ball to be forced against the chip pad to produce the ball bond. The bonder reverses direction sliding up over the wire and moves over the substrate pad as the wire is fed out of the capillary forming a wire loop. The bonder produces a second bond on the substrate pad or lead in the same manner. In the final step, the bonder is raised and the wire is broken at the point of the second bond to complete the circuit between the chip and the substrate. The spark does not arc across the guide opening of the capillary which would occur if capillaries produced by the prior art CVD processes were used. Because of the particular characteristics of the silicon carbide capillary of the present invention, wicking of the molten metal up the axially extending passage does not occur. In addition, capillaries of the present invention exhibit substantially increased resistance to thermal shock over standard alumina capillaries. In fact, the CVD silicon carbide capillaries of the present invention have been found to have nine times the wear life of alumina capillaries in the EFO bonding process and, hence, have very great market appeal.

The silicon-containing gas used to form the silicon carbide coating can be selected from the group consisting of silicon tetrachloride, silane, dichlorosilane, trichlorosilane, methyl trichlorosilane and dimethyl dichlorosilane. If silicon tetrachloride, silane, dichlorosilane or trichlorosilane is used, it is necessary to supply a source of carbon to produce silicon carbide. The source of carbon can be any hydrocarbon, preferably low molecular weight aliphatic hydrocarbons such as paraffins, alkenes, and alkynes having one to six carbon atoms, and aromatics and other hydrocarbons having one to six carbon atoms which do not contain oxygen. Particularly suitable examples include methane, ethane, propane, butane, methylene, ethylene, propylene, butylene, acetylene and benzene.

A typical bonding apparatus for bonding a fine electrical conductor wire to an electrical component which uses capillaries of the present invention comprises:

(1) a platform or work station for the component;
(2) means spaced from the platform for holding a coil of the wire;
(3) a capillary of the type described above;
(4) transducer means for transmitting an ultrasonic sound and for supporting the capillary;
(5) means for guiding the wire from the coil holding means to the transducer means; and
(6) an electric spark generating means between the coil holding means and the platform for generating and directing an electrical spark at the wire passing through the guide opening in the capillary and for repeatedly forming the molten ball below the guide opening.

DETAILED DESCRIPTION OF THE INVENTION

Figure 1:
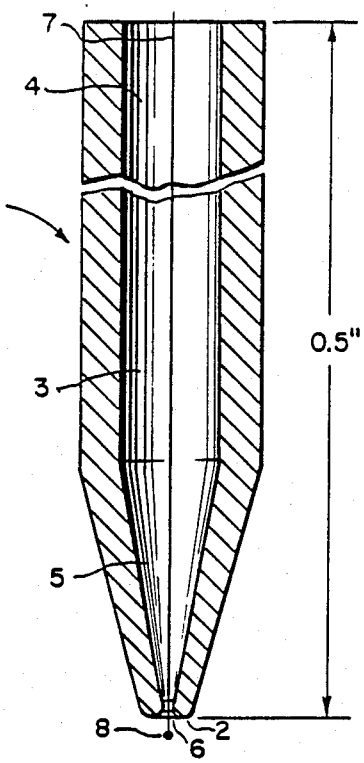
FIG. 1 is an enlarged vertical cross-sectional view of the capillary of the present invention.

FIG. 1 illustrates the shape of a conventional form of capillary 1 including tip 2 comprises an axially extending passage 3 which includes an upper cylindrical portion 4 communicating with an inwardly tapered conical portion 5 which in turn communicates with a terminal cylindrical guide opening 6. The inner surfaces of passage 3 must be smooth so as not to interfere with or scratch the surface of the fine wire or filament which is guided through capillary 1 with precision. Guide opening 6 is of practically capillary diameter ranging from about 0.001 inch to 0.007 inch for fine wire 7 which varies in diameter from about 0.001 to 0.004 inch.

The dimensions of the capillary shown in FIG. 1 vary depending on the diameter of wire 7 and the particular requirements of the bonding tool. If wire 7 is 0.0007 inch in diameter, guide opening 6 is approximately 0.001 inch, but if a greater diameter is used, say 5 mils, the diameter of opening 6 is about 7 mils. The length of a typical capillary is about ½ inch or sufficiently long so that wire 7 can be guided through capillary 1 without kinking and must be sufficiently narrow so that capillary tip 2 adjacent to guide opening 6 can engage molten ball 8 formed on the wire to join the pad on the circuit with the pad on the chip carrier. The prior art alumina capillaries were limited to about ½ inch in EFO bonding because of their thermal shock fracture resistance. However, the silicon carbide capillaries of the present invention are not length limited because of their greater thermal shock resistance. This permits the capillaries of this invention to be used in deep access bonding which require longer capillaries. The length of conical section 4 is approximately 1⅛ inch. The inside diameter of cylindrical portion 3 being about 1/16 inch in diameter.

Figure 2:
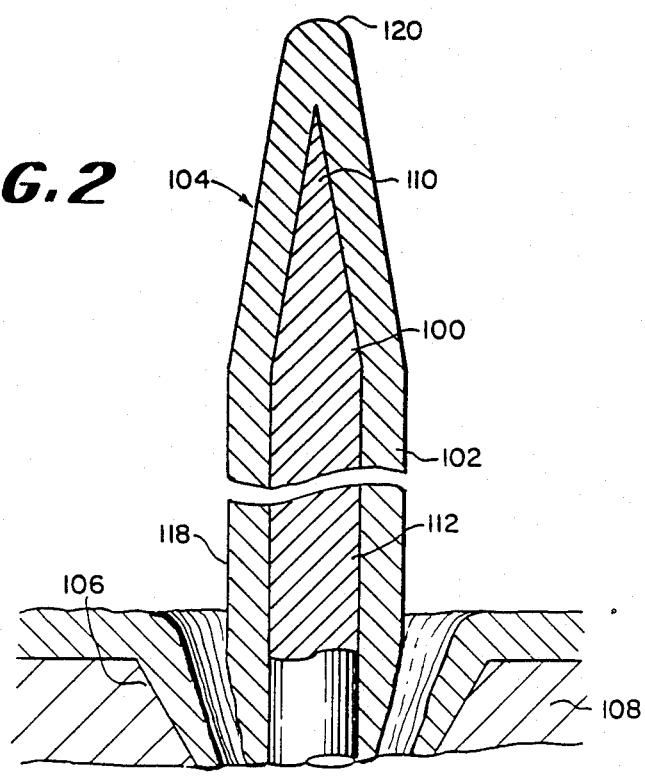
FIG. 2 is an enlarged vertical cross-sectional view illustrating a coated mandrel residing in a fixture after the silicon carbide has been chemically vapor deposited as a uniform solid coating thereon.

FIG. 2 illustrates mandrel 100 upon which has been deposited silicon carbide coating 102 of form CVD coated mandrel 104. Mandrel 100 comprises a material which can be easily removed from coated mandrel 104 to form passage 3 of capillary 1 of FIG. 1. A plurality of mandrels 100 are respectively mounted in a plurality of tapered recesses 106 within support tray 108 and tray 108 of mandrels 100 are then subjected to CVD coating in the manner described below in connection with a description of FIG. 3. Tapered projection 110 of mandrel 100 forms inwardly-tapered conical portion 5 and guide opening 6 of capillary 1. Cylindrical portion 112 forms cylindrical portion 4 as shown in FIG. 1. During the CVD process, continuous, solid integral coating 102 of silicon carbide is molecularly bonded to mandrel 100 to form capillary 1 of the desired wall thickness which is sufficient to allow subsequent exterior machining operations to suit the particular bonding tool. It has been found that a suitable thickness of coating 102 ranges from about 0.01 to 0.03 inch and preferably about 0.02 inch.

After the CVD process, silicon carbide coated mandrel 102 is removed from recess 106 in support tray 108. Without the countersunk recess, (see FIG. 6) a bridge of CVD silicon carbide will form (not shown) between the lower end of mandrel 100 and the upper surface of support tray 108 and must be broken adjacent coated end 118 before coated mandrel 104 can be removed from tray 108. Coated portion 120 at or adjacent to the end of tapered portion 112 is trimmed off by drilling, cutting, grinding or other machining operation to give capillary guide opening 6 of the proper diameter when mandrel 100 is removed. Coated mandrel 104 is placed in a jig (not shown) with coated end 118 in the upright position and end 118 is cut, ground or otherwise machined by suitable means so that capillary 1 will have the desired length.

The composition of mandrel 100 can comprise graphite, tungsten, molybdenum or other suitable material which can withstand the processing condition and can easily be removed by chemical or combustion means from capillary 1 and leave a substantially smooth interior surface. A particularly effective composition for the mandrel is a graphite which is substantially free of additives and other extraneous matter. The most effective means is to burn out the graphite mandrel in a furnace at temperatures in the range of 1100° to about 1300° C. Preferably this is done by placing coated graphite mandrel 104 in a furnace and applying dry air at these temperatures for a sufficient period of time to completely burn out mandrel 100. In case of tungsten and molybdenum, the most effective means of removing the mandrel is to chemical etch.

Figure 3:
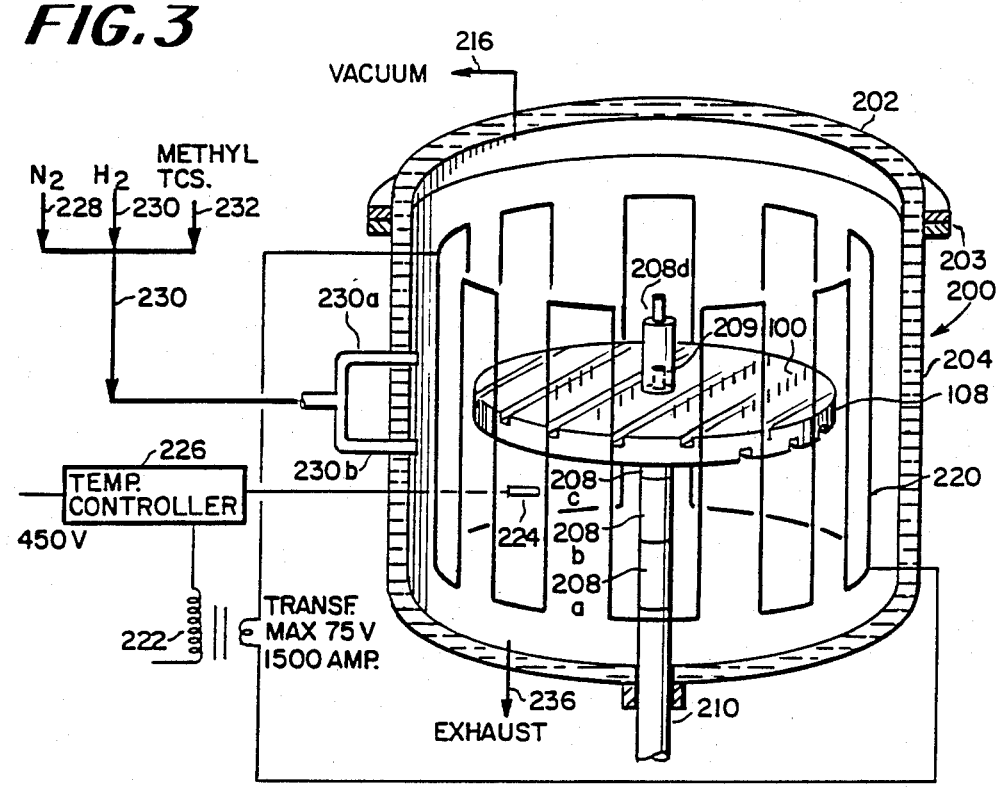
FIG. 3 is a schematic elevational view, partly in section, of the chemical vapor deposition apparatus, containing the support for the plurality of mandrels upon which the vapor deposited silicon carbide coatings are formed.
Figure 4:
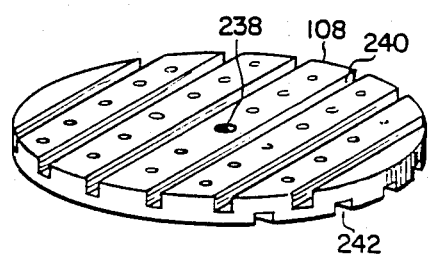
FIG. 4 is a schematic view illustrating one type of fixture used to hold the mandrels during the CVD coating operation.
Figure 5:
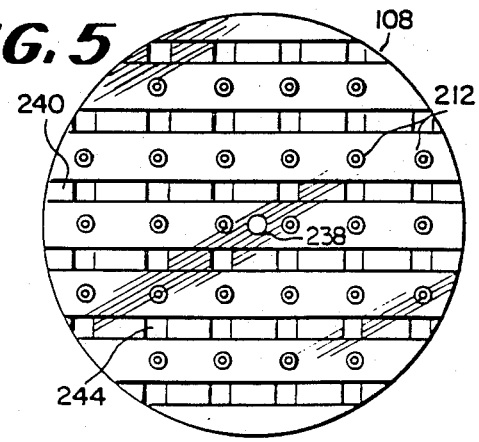
FIG. 5 is a top view of the fixture used to hold the mandrels during the CVD coating operation.

Now referring to FIGS. 3, 4 and 5, water cooled, resistance heated reactor 200 having a removable top 202 and reactor body 204 having complimentary mating flanges 205. Support tray 108 is mounted on extension 208 attached to rotatable shaft 210 which passes through body 204 from the bottom as shown and is rotated by suitable means (not shown). Support tray 108 is in turn mounted on extensions 208a, 208b and 208c. Mandrels 100 are located within the countersunk holes 212, which correspond to tapered recesses 106 in FIG. 2 and are described in more detail under the description of FIG. 6. The production capacity of reactor 200 can be increased by the addition of multiple trays 108 which are spaced from each other by means of appropriately sized extensions to provide sufficient clearance for the mandrels and to provide uniform gas flow. In FIG. 3, it can be seen that an addition support tray can be mounted on extension 208a. Extension 208d is shown mounted as a slip fitting on male portion 209 of extension 208c to facilitate stacking of addition trays. If extension 208d is not used, a suitable cap (not shown) is placed over male portion 209 to prevent it from being coated. After mounting the mandrels, lid 202 is clamped shut, and the system is leak tested by pressurizing with nitrogen through lines 228, 230, 230a and 203b and then a vacuum is pulled by means of vacuum system 216 to remove substantially all of the air and nitrogen. Reactor 200 is then heated to a temperature in the range of about 1300° to about 1375° C. by means of resistance heater 220 which is connected to transformer 222 for reducing the 450 volt charge to approximately 75 volts and approximately 1000 amperes. Temperature sensor 224 causes temperature controller 226 to modify the primary voltage on transfomer 222 causing the power supplied to heater 220 to be changed, in turn changing the temperature in reactor 200 relative to the setpoint in controller 226. Upon reaching the desired temperature within the range of about 1200°-1400° C., hydrogen is then introduced into reactor 200 at a flow rate dependent on the overall volume of reactor 200 in order to bring the reactor to atmospheric pressure within a reasonable period of time. The hydrogen is continued after the reactor reaches atmospheric pressure by exhausting it through line 236 to an exhaust scrubber (not shown) for approximately one-half hour to stabilize the reactor temperature and to further clean the mandrels 100 to make sure particulate matter and any nitrogen remaining from the previous purge has been removed from reactor 200 before introduction of the silicon-containing gases such as methyl trichlorosilane (MTS) through lines 232, 230, 230a and 230b. The gases are introduced above and below support tray 108 to allow of an even distribution within the reactor.

Figure 6:
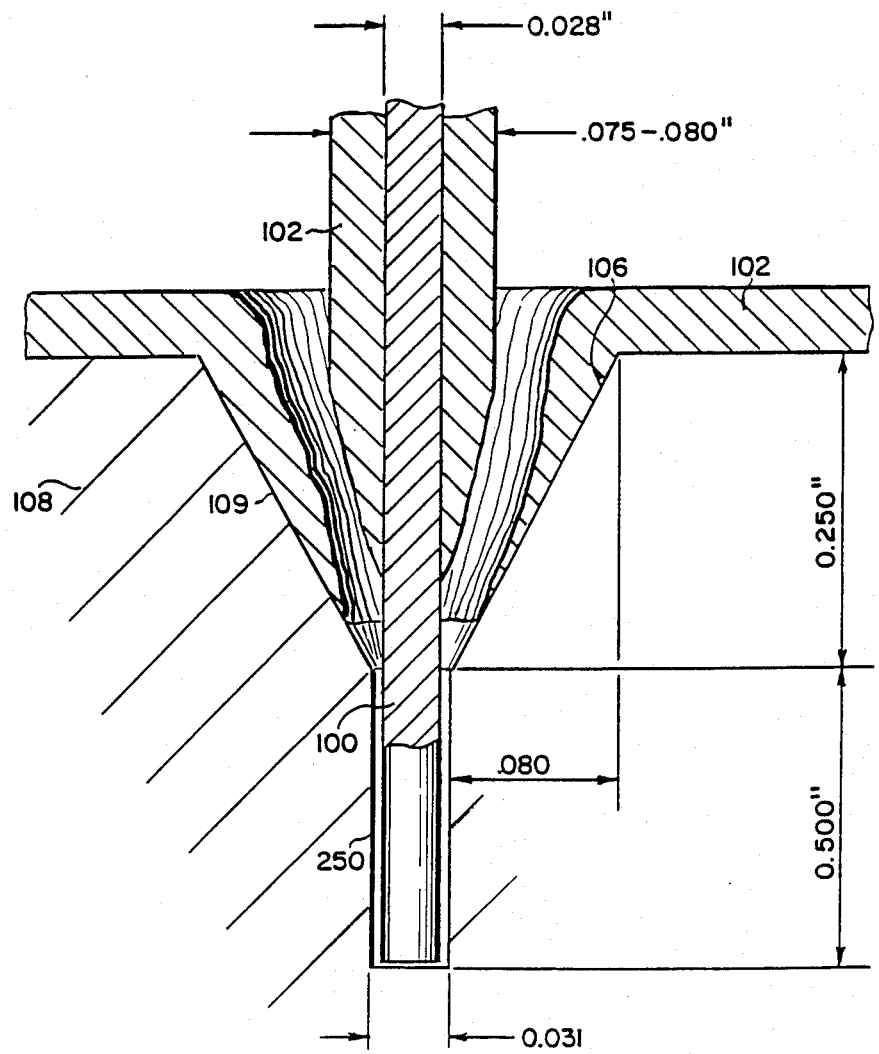
FIG. 6 is a vertical cross-sectional view of the coated mandrel mounted in one of the holes of the fixture illustrated in FIG. 4.

FIGS. 4, 5 and 6 illustrate a preferred embodiment of the type of support tray for mandrels 100 which are designed to provide uniform flow of reactant gases during the CVD operation and to prevent any bridging of CVD coating between the upper surface of the support tray 108 and the lower end of mandrel 100. This latter feature permits one to remove coated mandrels 104 without shearing or fracturing them. It has been found that if the bridging of CVD is allowed to build up between the latter surfaces, the removal of coated mandrels 104 from tray 108 causes stress fractures along the longitudinal axis of coating 102, thus leading to the failure of capillaries 1 in the machining step.

FIGS. 4 and 5 show the preferred embodiment in which circular support tray 208 comprising graphite substantially free of foreign matter has a diameter such that it can easily be placed within reactor 200. Tray 108 is mounted on extension 208 by means of orifice 238. Tray 108 contains a plurality of upper grooves 240 having a depth slightly greater than one-half the thickness of tray 108, which thickness typically is approximately two inches. Lower grooves 242 having the same depth as those of grooves 240 are cut into tray 108 perpendicular to grooves 240 to form a plurality of square holes 244. Countersunk holes 212 are drilled to the desired depth equally along the spaces between upper grooves 242 as shown. This placement of square holes 244 and countersunk holes 212 provides for a uniform distribution of gases throughout the external surface of mandrels 100 above the surface of tray 108. This leads in turn to an even distribution of coating so that finished coated mandrels 104 have the desired coating concentricity. Coating concentricity is measured by cutting through coated mandrel 104 perpendicular to the longitudinal axis thereof and measuring the variations in the resulting cross sections.

FIG. 6 shows tapered wall 109 of countersunk hole 212 in support tray 108 forms an angle of approximately 75° with the surface of tray 108 or 15° from the vertical axis of hole 212. This angle should be at least 10° and no more than 20° from the vertical to prevent bridging of silicon-carbide. The tapered portion of hole 212 is drilled to a depth of approximately 0.25 inch in the example in which mandrel 100 has a diameter of approximately 0.028 inch. The remaining portion of hole 212 has side walls 250 parallel to the longitudinal axis of mandrel 100, a diameter of approximately 0.031 inch and a depth of approximately 0.5 inch. The latter dimension provides the necessary degree of stability for mandrel 100 during the CVD coating operation. During this operation, the reactive gases do not diffuse well into recess 106 below this depth, thus avoiding the bridging of deposited material, as discussed above. It is apparent that the exact dimensions of countersunk holes 212 will depend on the dimensions of the capillaries to be manufactured, the desired coating thickness, and the gas flow geometry of a given reactor.

Figure 7:
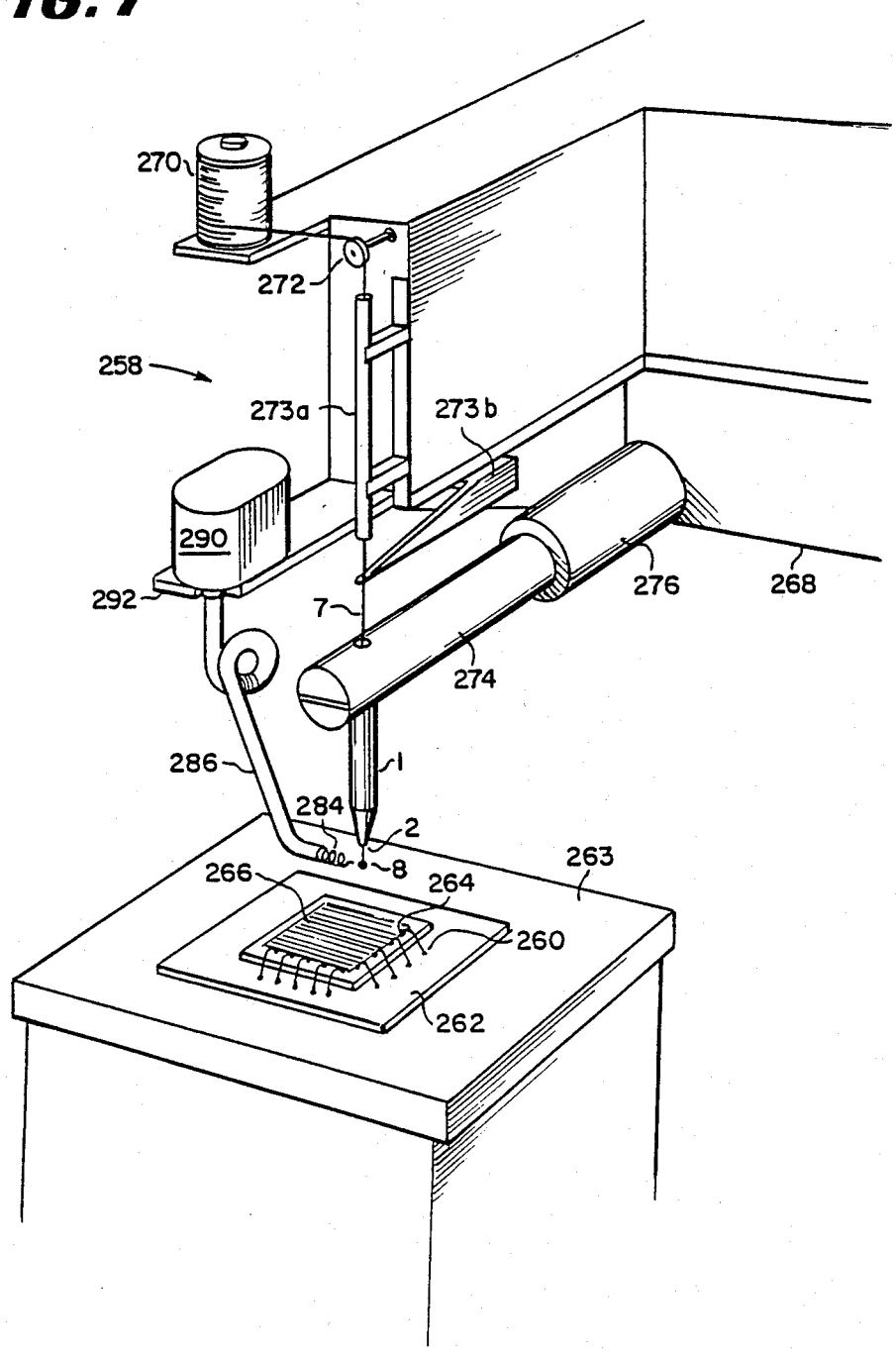
FIG. 7 is a schematic view illustrating one type of bonding apparatus using the capillary of the present invention.

FIG. 7 schematically illustrates wire bonder 258 for carrying out the thermosonically bonding process which is well known in the art for joining wire 7 from lead 260 on chip support 262, which is placed on platform 263, to pad 264 on chip 266. Bonder 258 housed within frame 268 comprises means 270 spaced from work station 262 for holding a spool of wire 7. Wire 7 is fed over pulley 272 through support sleeve 272 and guide means 273 for guiding wire 7 down through ultrasonic transducer 274 operably connected to transducer 276, capillary 1 and tip 2 as shown. Ball 8 on wire 7 is formed by the plasma generated from the electric spark 284 which is produced and passed through copper electrode 286 by means of electric spark generator 290 mounted on suitable support 292. Spark 282 is directed to the end of wire 7 protruding through capillary tip 2. Because capillary 1 is substantially free of any conductive material, spark 284 does not arc across the tip which would introduce unwanted heat buildup within guide opening 6 and possibly prevent the necessary reciprocal motion of wire 7 during the bonding process.

The examples below are intended to illustrate the foregoing process of preparing the capillaries of the present invention and to demonstrate the superiority of such capillaries over those produced by a CVD process of the prior art.

EXAMPLE 1

In place of the support tray as described above in connection with FIG. 6, a block of graphite was used approximately 2 inches thick and containing 52 holes having diameters of 0.031 inch, depths of about 1 inch and side walls perpendicular to the surface of the tray. Fifty two pieces of Electronite E-440 graphite, which were thoroughly cleaned by rolling the pieces in an acetone dampened cloth to remove any impurities, were placed in the latter support tray for CVD processing. Each of the pieces were 1.5 inches long and 0.03 inch in diameter. The support tray was placed on extension 208 within reactor 200 shown in FIG. 3 and reactor lid 202 was affixed to reactor body 204 by means of bolts through flange 205. Vacuum grease was used on the flange surfaces to provide a vacuum type seal which was checked by pressurizing reactor 200 with nitrogen to 10–15 psig with exhaust 236 closed and then stopping the the flow of nitrogen to seal off reactor 200. The pressure in reactor 200 was observed over a ten minute period to ensure that no more than 0.3 psi pressure was lost. The exhaust line 236 was then opened to allow the pressure in reactor 200 to reach atmospheric. The exhaust line 236 was then closed and a vacuum of 29.5 in. Hg was then pulled by means of vacuum system 216. Reactor 200 was heated to 1350° C. by increasing the power supply from transformer 222 to 72 volts and 900 to 1100 amperes. Upon reaching this temperature, hydrogen was purged through lines 230, 130a and 230b into reactor 200 until the pressure in reactor 200 reached atmospheric. At this time exhaust line 236 was opened to establish a hydrogen flow through reactor 200. Hydrogen was allowed to flow at a rate of 115 SLPM for one half hour to assure that all traces of oxygen were removed from reactor 200, to stabilize reactor 200 internal temperature and to clean the graphite substrates in tray 200 to make sure they were free of any grease, particulates and oxides. Gaseous MTS at 10 SLPM and hydrogen at 90 SLPM were passed lines 232, 230, 230a, 230b and through reactor 200 for a total period of 7½ hours. The rate of flow of MTS is critical to achieve in the finished capillary a uniform grain size of silicon carbide. Specifically this is achieved by maintaining the silicon carbide deposition rate at approximately 2.2 mils per hour which achieves the optimum crystal growth in the shortest period of time. The lowest rate to achieve sufficient grain size is about 1 mil silicon carbide per hour and the highest practical rate is about 3 mils. After this period, the flow of MTS was stopped and the hydrogen flow continued for 10 minutes to purge out any remaining MTS from the system. The power was shut off and the hydrogen purge continued for an additional 1½ hours until no further glow was visible by the naked eye through a sight glass (not shown) in reactor 200. At this stage, the temperature in the reactor has been reduced to less than 500° C. Hydrogen was removed from the system by turning off hydrogen feed to reactor 200 and then allowing nitrogen to enter through lines 228, 230, 230d, 230b and out exhaust 236. This was continued until the exhaust gas no longer burned indicating that most of the hydrogen had been removed from rector 200. Five (5) purge cycles were then performed. Each cycle consisted of closing exhaust line 236 while nitrogen continued to flow into reactor 200. When the pressure reached 5 psig the exhaust line was opened until the pressure reached atmospheric. Lid 202 was removed and coated mandrels 104 were removed from support tray 108. Due to the bridging effect because of the straight walls of the support tray as discussed above, 11 of the coated mandrels were broken during this removal step. The use of the design of tray 106 described in reference to FIG. 6 virtually eliminates such breakage. The coated mandrels having a coating thickness of about 20 mils were machined as discussed above and were fired in a furnace at about 1200° C. to remove the graphite. All of the capillaries were inspected under a microscope and any surface irregularities were machined. The finished capillaries had the necessary uniform grain size and coating concentricity as measured in an electron microscope at 108 magnification. The capillaries had a density of 3.2 gm/cm$^3$, a uniform Vickers hardness of 3000, a tensile strength of 100,000 psi, modulus of elasticity of $70 \times 10^6$ psi and a coefficient of thermal expansion $4.8 \times 10^{-6}$ cm/cm/° c. The capillaries were tested in thermosonic bonding devices of the type described in the Model 2460 EFO bonding machine by Hughes and found to have 9 times the wear life of alumina capillaries currently available on the market. The resistivities of the resulting capillaries were sufficiently high so that arcing did not occur during use in such bonding devices.

EXAMPLE 2

Nineteen coated mandrels were prepared by substantially the same CVD coating procedure as that set forth in Example 1 with the following exceptions:
(1) a reactor was used similar to that used in Example 1;
(2) a tapered support tray was used similar to that shown in FIG. 6;
(3) molybdenum mandrels having the same dimensions as the graphite mandrels were used;
(4) nitrogen was fed into the reactor at about 245 SLPM rather than 115 SLPM;
(5) hydrogen was fed into the reactor at about at feed rates that varied from 180 to 270 SLPM rather than 90 SLPM;
(6) MTS was fed into the reactor at feed rates that varied from about 20 to about 30 SLPM rather than a substantially constant 10 SLPM; and
(7) the CVD coating was accumulated to the desired thickness of 20 mils over the course of several runs for a total on-stream time for the same total MTS feed time of 7½ hours rather than a
continuous on-stream time for MTS as in Example 1. The molybdenum mandrels were removed from the resulting capillaries by use of a chemical etchant comprising 4 parts of concentrated HNO$_3$ and 1 part concentrated H$_2$SO$_4$. The resulting capillaries had, for the most part, the same physical properties including wear life as those obtained in Example 1, except that the coating concentricity measurement identified discreet layers of silicon carbide that were build up during the separate runs referred to above.

CONTROL

In initial attempts to make capillaries by prior art CVD techniques as generally described in Holzl et al, U.S. Pat. No. 3,472,443, the capillary product yield was very low and the resulting capillaries had such poor coating concentricity as to be, for the most part, not usable. These techniques included using a vacuum throughout the addition of MTS and hydrogen which is believed to introduce oxygen into the CVD coating system. The specific conditions used in this control run were to pull a 72 Torr vacuum on a reactor generally of the type shown in FIG. 5 of the foregoing reference; use an RF generator with about 10 KW of power to inductively heat the interior reactor walls; use a graphite extension and capillary support tray; use 5 SLPM for the nitrogen purge; use 10 SLPM for the hydrogen purge; heat the internals of the reactor to 1100° C., continue to maintain the flow of hydrogen at 10 SLPM and introduce MTS at 7.5 SLPM which gases increase the pressure in the reactor to about 100 Torr (about 1/7 of an atmosphere) throughout the CVD deposition period; gradually increase temperature to 1330° C. by raising the power supply to 6.5 KW for a period of 48 minutes at this temperature; purge with 5 SLPM of nitrogen with the power turned off, to reduce the temperature to about 100° C.; stop nitrogen flow; disconnect all lines and vacuum connection, and remove the coated parts from the reactor. The resulting coated mandrels had high surface irregularities and nonuniform cross-sectional diameters and, hence, poor coating concentricity making them unusable as capillaries in bonding machines.

What is claimed is:
1. A method of making a capillary having an axially extending passage terminating in a relatively small diameter opening at one end thereof through which a fine electrical conductor wire is adapted to pass comprising the steps of:
   (a) chemically vapor depositing a substantially smooth outer refractory coating into a substrate having a tapered end by introducing, in the absence of oxygen or oxygen containing compound, a gaseous mixture capable of depositing silicon carbide onto the substrate;
   (b) controlling the rate of deposition of silicon carbide onto the substrate within the range of about 1 to 3 mils/hour at a temperature in the range of about 1200° to 1400° C.;
   (c) machining the resulting silicon carbide coated substate to the desired length;
   (d) machining the resulting tapered end of the coating to the desired diameter; and
   (e) removing said substrate from the outer silicon carbide coating to form said axially extending passage and the guide opening through which the wire to be bonded is fed.
2. The method of claim 1 wherein said substrate is mounted within means for chemically vapor depositing silicon carbide onto said substrate and the exterior of a support tray without causing undesirable bridging of silicon carbide between the resulting coated substrate and said tray.
3. The method of claim 2 wherein the substrate is located within a countersunk hole in a support tray with the portion of said countersunk hole adjacent to the surface of said support tray is tapered at an angle of at least 10° and no more than 20° from the vertical and the remaining portion of said countersunk hole is of sufficient diameter to accept the diameter of said substrate and to maintain said substrate in an upright position during the chemical vapor deposition.
4. The method of claim 1 wherein said gaseous mixture comprises hydrogen and a silicon containing gas selected from the group consisting of silicon tetrachloride and a source of carbon, silane and a source of carbon, dichlorosilane and a source of carbon, trichlorosilane and a source of carbon, methyl trichlorosilane, and dimethyl dichlorosilane.

5. The method of claim 1 wherein said source of carbon is selected from the group consisting of paraffins, alkenes, and alkynes having one to six carbon atoms, aromatics and other hydrocarbons having one to six carbon atoms which do not contain chemically combined oxygen.

6. The method of claim 1 wherein said substrate comprises a material which can be removed by chemical means or by combustion.

7. The method of claim 6 wherein said substrate comprises molybdenum or tungsten which is removed by a chemical etchant.

8. The method of claim 6 wherein said substrate comprises graphite which is removed by combustion.

* * * * *

UNITED STATES PATENT AND TRADEMARK OFFICE
CERTIFICATE OF CORRECTION

PATENT NO. : 4,861,533

DATED : August 29, 1989

INVENTOR(S) : Bertin et al

It is certified that error appears in the above-identified patent and that said Letters Patent is hereby corrected as shown below:

Claim 1(a), Line 35
    Replace "into" with -- onto --

Signed and Sealed this

First Day of January, 1991

Attest:

HARRY F. MANBECK, JR.

*Attesting Officer*      *Commissioner of Patents and Trademarks*